(12) United States Patent
Iida et al.

(10) Patent No.: US 11,965,921 B2
(45) Date of Patent: Apr. 23, 2024

(54) MEASUREMENT SYSTEM AND MEASUREMENT METHOD

(71) Applicant: ANRITSU CORPORATION, Atsugi (JP)

(72) Inventors: Hiroaki Iida, Atsugi (JP); Koki Iwata, Atsugi (JP); Kayoko Horiuchi, Atsugi (JP)

(73) Assignee: ANRITSU CORPORATION, Atsugi (JP)

( * ) Notice: Subject to any disclaimer, the term of this patent is extended or adjusted under 35 U.S.C. 154(b) by 111 days.

(21) Appl. No.: 17/934,016

(22) Filed: Sep. 21, 2022

(65) Prior Publication Data

US 2023/0096249 A1 Mar. 30, 2023

(30) Foreign Application Priority Data

Sep. 30, 2021 (JP) .................................. 2021-161542

(51) Int. Cl.
*G01R 29/08* (2006.01)
*G01R 23/06* (2006.01)
(Continued)

(52) U.S. Cl.
CPC ......... *G01R 29/0892* (2013.01); *G01R 23/06* (2013.01); *G01R 23/167* (2013.01); *H04B 17/17* (2015.01)

(58) Field of Classification Search
CPC .... H04B 17/346; H04W 88/02; H04W 24/08; H04W 88/08; H04W 28/0236; H04W 72/542; H04W 52/0209; H04L 27/2614; H04L 5/001; H04L 5/0005; H04L 43/50; G06F 11/3409; G06F 11/3668;
(Continued)

(56) References Cited

U.S. PATENT DOCUMENTS 8,872,504 B2 * 10/2014 Suryan ............... G01R 13/0218
324/76.29
9,377,495 B2 * 6/2016 Chien .................. G01R 29/105
(Continued)

FOREIGN PATENT DOCUMENTS

JP 2001189700 A 7/2001
JP 2011199719 A 10/2011
(Continued)

*Primary Examiner* — Vinh P Nguyen
(74) *Attorney, Agent, or Firm* — Greer Burns & Crain Ltd.

(57) ABSTRACT

A measurement system and method tests for spurious emissions included in a signal transmitted from a mobile terminal in a shorter time than before. The system includes: a band division unit for dividing the measurement frequency band into a plurality of divided bands; a first spurious measurement control unit which causes a measurement device to measure the spurious emissions of the signal to be measured in each divided band and the peak power of the spear in each divided band; and a first pass/fail determination unit that determines whether or not pass determination criteria is satisfied. The first pass/fail determination unit determines whether the peak power does not exceed the threshold of the pass determination criteria in each divided band. The threshold value of the pass determination criteria is lower than the threshold of the standard determination criteria defined by the 3GPP standard.

4 Claims, 5 Drawing Sheets

(51) Int. Cl.
*G01R 23/167* (2006.01)
*H04B 17/17* (2015.01)

(58) Field of Classification Search
CPC ....... H04M 1/24; G01R 23/06; G01R 23/167; G01R 29/0892
See application file for complete search history.

(56) References Cited

U.S. PATENT DOCUMENTS

| | | | |
|---|---|---|---|
| 9,413,570 B2 * | 8/2016 | Kikuchi | H04L 5/143 |
| 11,175,327 B2 * | 11/2021 | Nakamura | G01R 23/16 |
| 11,336,379 B2 * | 5/2022 | Kikuchi | H04L 5/14 |

FOREIGN PATENT DOCUMENTS

| | | | |
|---|---|---|---|
| WO | 2019202732 A1 | 10/2019 | |
| WO | 2021029071 A1 | 2/2021 | |
| WO | WO2021029071 A * | 2/2021 | |

* cited by examiner

| Frequency | Offset [dB] |
|---|---|
| 9kHz~6GHz | −3.0 |
| 6GHz~12.75GHz | −3.0 |
| 12.75GHz~ | −3.0 |

MEASUREMENT SYSTEM AND MEASUREMENT METHOD

CROSS-REFERENCE TO RELATED APPLICATIONS

This application claims Convention priority to Japanese Patent Application No. 2021-161542, filed Sep. 30, 2021, the entire contents of which are incorporated herein by reference.

FIELD OF THE INVENTION

The present invention relates to a measurement system and a measurement method, particularly to a measurement system and a measurement method to perform a conformance test compliant with 3GPP Standard for an object to be measured that has a wireless transmission function.

PRIOR ART

In recent years, 5G services that operate millimeter-wave band frequencies have started in each country, and production of 5G mobile terminals such as 5G smartphones is in full swing. In a 5G mobile terminal design/development company or its manufacturing factory, a performance test is performed to measure the output level of transmission wave and reception sensitivity and determine whether or not the 5G mobile terminal meets a predetermined standard through a wireless communication antenna provided in the 5G mobile terminal.

Among such performance tests, there is a conformance test that confirms whether the object to be measured such as a mobile terminal or base station device complies with the 3GPP (3rd Generation Partnership Project) standard. In the conformance test, a testcase (Test Case), in which the test purpose, pass (PASS) determination criteria, fail (FAIL) determination criteria, test conditions, test items identified by the Test ID, and test procedures are defined, are performed.

Patent Document 1 describes a test system that controls various test devices to perform tests in response to test cases according to the functions and performances of one mobile terminal.

In the spurious measurement in a test system as disclosed in Patent Document 1, the basic idea of the conventional measurement method is to make a PASS/FAIL determination by examining all of them as shown in (1) to (4) below.
(1) Sweep the measurement frequency band to find the peak of spurious.
(2) For each peak searched in (1), the frequency and level are investigated under the measurement conditions that satisfy the measurement accuracy of the 3GPP standard.
(3) Perform PASS/FAIL determination of each peak level based on the standard determination value.
(4) Repeat steps (2) and (3) for the required peaks.

This means that the conventional measurement method is to sweep a considerable number of measurement frequency bands with a spectrum analyzer and perform run time corrections until all spurious frequencies and levels in the measurement frequency band can be obtained. The advantage of conventional measurement method is that the spurious frequency and level can be obtained with reproducibility regardless of the standard determination value.

CITATION LIST

Patent Literature

[Patent Document 1] Japanese Patent Application Publication No. 2011-199719

SUMMARY OF THE INVENTION

Technical Problem

However, since the conventional measurement method has a demerit that the measurement time is very long because the frequencies and levels of all spurious in the measurement frequency band are obtained. For the user, what is important is whether or not the object under measurement has passed the spurious test, and the measured spurious frequencies and levels are often insignificant.

Some of the recent spurious test cases have combinations of test items and test condition parameters. To cite a typical example, in the additional spurious test of DC_3A-41A, there are a total of 775 combinations of test item and test condition parameters. In addition to this, there are several measurement bands, so even if the test result is obtained by one sweep of the spectrum analyzer, the total sweep argument reaches 3530. When this is tested by a conventional measurement method, there is a problem that a "virtually never-ending" test case is created.

The present invention has been made to solve such a conventional problem, and it is an object of the present invention to provide a measurement system and a measurement method capable of performing a measurement for determining a pass/fail of a spurious test in a shorter time than before.

Means to Solve the Problem

In order to solve the above problems, the measurement system according to the present invention is a measurement system comprising: a measurement device; and a control device that causes the measurement device to measure spurious included in a signal to be measured transmitted from an object to be measured, wherein the control device is provided with a band division unit that divides measurement frequency band into a plurality of divided bands, a first spurious measurement control unit that causes the measurement device to measure spurious of the signal to be measured in each of the divided bands, and a first pass/fail determination unit that determines whether or not a peak power of the spurious in each of the divided bands measured by the measurement device satisfies pass determination criteria according to each of the divided bands, and the first pass/fail determination unit determines the peak power that does not exceed the threshold value of the pass determination criteria in each divided band as the peak power that satisfies the pass determination criteria, and determines the peak power that exceeds the threshold value of the pass determination criteria as the peak power that does no satisfy the pass determination criteria, and the threshold value of the pass determination standard is a power value lower than the threshold value of the standard determination criteria defined by the 3GPP standard.

By this configuration, the measurement system according to the present invention is adapted to use a threshold value of the pass determination criteria lower than the threshold value of the standard determination criteria defined by the 3GPP standard in the spurious test. Since the measurement system according to the present invention can be lower the measurement accuracy instead of setting the threshold value of the pass determination criteria stricter than the threshold value of the standard determination criteria, the measurement for making the pass determination of the spurious test can be completed in a shorter time than before. As a result, the measurement system according to the present invention can speed up the design and development of wireless devices such as mobile terminals and base station devices by users.

In addition, the control device of the measurement system according to the present invention may be further provided with: a partial band determination unit that determines a partial band having a predetermined bandwidth including the spurious having a peak power determined not to satisfy the pass determination criteria by the first pass/fail determination unit in the measurement frequency band; a second spurious measurement control unit that causes the measurement device to measure the spurious of the signal to be measured in the partial band, in a state where a measurement accuracy higher than the measurement by the control of the first spurious measurement control unit is satisfied; and a second pass/fail determination unit that determines whether or not the peak power of the spurious in the partial band remeasured by the measurement device satisfies the standard determination criteria according to the partial band, and the second pass/fail determination unit may be configured to determine the peak power that does not exceed the threshold value of the standard determination criteria as the peak power that satisfies the standard determination criteria, and determine the peak power that exceeds the threshold value of the standard determination criteria as the peak power that does not satisfy the standard determination criteria.

By this configuration, the measurement system according to the present invention is configured to cause the measurement device to perform the remeasurement of the spurious of the signal to be measured with the measurement accuracy raised, in the partial band including the spurious having the peak power determined not to satisfy the pass determination criteria by the first pass/fail determination unit. As a result, the measurement system according to the present invention can obtain the frequency and level of the spurious determined to be FAIL, with high measurement accuracy.

Further, the measurement method according to the present invention is a measurement method to cause a measurement device to measure spurious included in a signal to be measured transmitted from an object to be measured, the method comprising: a band division step to divide measurement frequency band into a plurality of divided bands; a first spurious measurement control step to cause the measurement device to measure the spurious of the signal to be measured in each of the divided bands; and a first pass/fail determination step to determine whether or not a peak power of the spurious in each of the divided bands measured by the measurement device satisfies the pass determination criteria according to each of the divided band, and the first pass/fail determination step determines the peak power that does not exceed the threshold value of the pass determination criteria in each of the divided band as the peak power satisfying the pass determination criteria, and determines the peak power exceeding the threshold value of the pass determination criteria as the peak power not satisfying the pass determination criteria, and the threshold value of the pass determination criteria is a power value lower than the threshold value of the standard determination criteria defined by the 3GPP standard.

In addition, the measurement method according to the present invention may be further provided with: a partial band determination step to determine a partial band having a predetermined bandwidth including the spurious having a peak power determined not to satisfy the pass determination criteria by the first pass/fail determination unit in the measurement frequency band; a second spurious measurement control step to cause the measurement device to perform a remeasurement of the spurious of the signal to be measured in the partial band, in a state where a measurement accuracy higher than the measurement by the control of the first spurious measurement control unit is satisfied; and a second pass/fail determination step to determine whether or not the peak power of the spurious in the partial band remeasured by the measurement device satisfies the standard determination criteria according to the partial band, and the second pass/fail determination step may be configured to determine the peak power that does not exceed the threshold value of the standard determination criteria as the peak power that satisfies the standard determination criteria, and to determine the peak power that exceeds the threshold value of the standard determination criteria as the peak power that does not satisfy the standard determination criteria.

Effect of the Invention

The present invention provides a measurement system and a measurement method capable of performing a measurement for determining the pass/fail of a spurious test in a shorter time than before.

DETAILED DESCRIPTION OF EMBODIMENTS

Hereinafter, embodiments of the measurement system and measurement method according to the present invention will be described with reference to the drawings.

Figure 1:
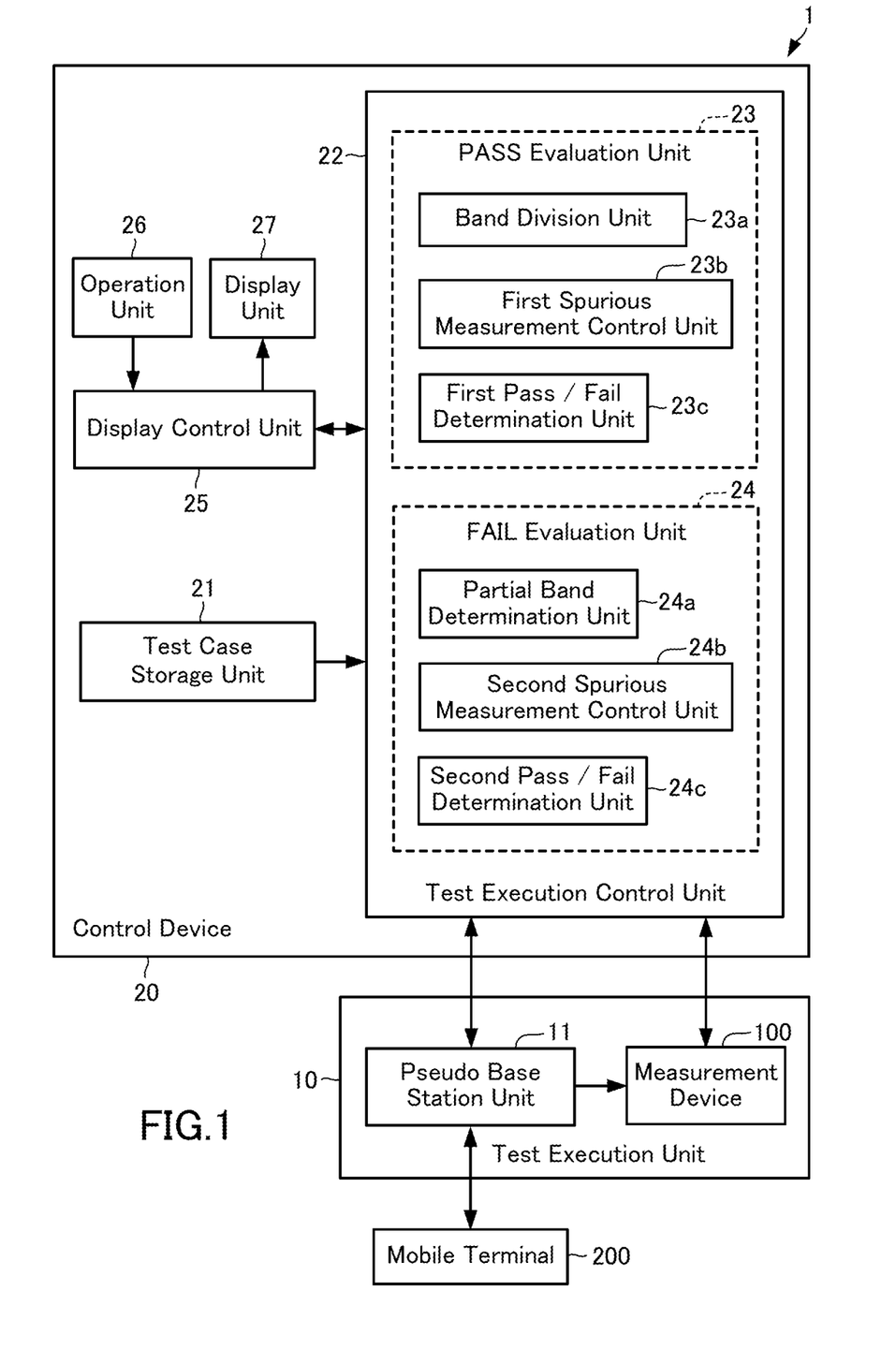
FIG. 1 is a block diagram showing a configuration of a measurement system according to an embodiment of the present invention.

The measurement system 1 according to the present embodiment shown in FIG. 1 causes a measurement device 100 to measure spurious included in an RF signal (hereinafter, also referred to as "signal to be measured") transmitted from an object to be measured, and is provided with a test execution unit 10 and a control device 20. The object to be measured has, for example, a wireless transmission function such as a mobile terminal or a base station device. Hereinafter, the case where the object to be measured is the mobile terminal 200 will be described as an example.

The test execution unit 10 has a pseudo base station unit 11 and a measurement device 100. Under the control of the control device 20, the pseudo base station unit 11 makes a wireless communication connection or a wired communication connection with the mobile terminal 200, and exchanges call connections and signaling messages. Further, the pseudo base station unit 11 outputs the state of communication with the mobile terminal 200 to the control device 20.

Figure 2:
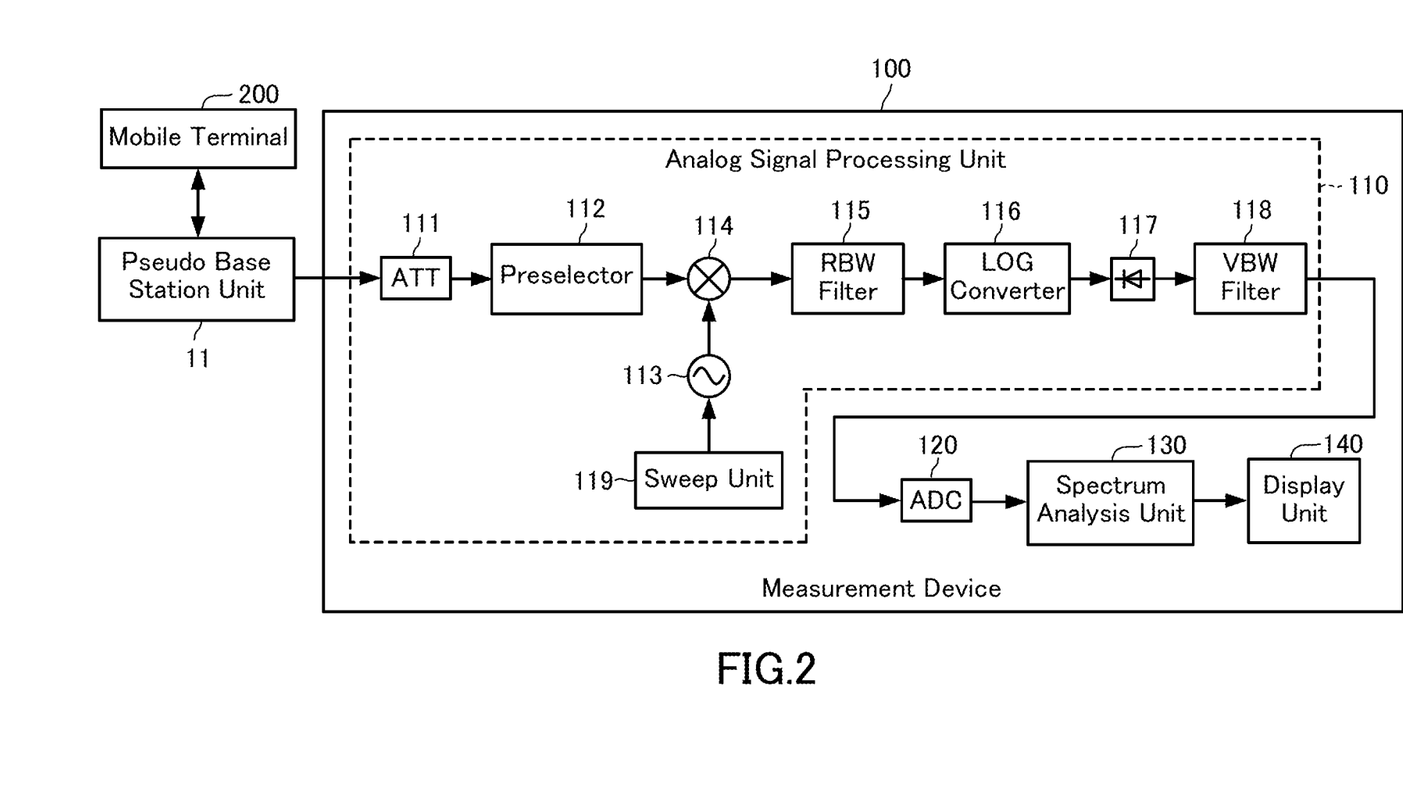
FIG. 2 is a block diagram showing a configuration of a measurement device included in the measurement system according to the embodiment of the present invention.

The measurement device 100 is, for example, a spectrum analyzer, which measures the frequency characteristics of the signal strength (for example, signal power) of the signal to be measured and displays the waveform of the frequency spectrum. As shown in FIG. 2, the measurement device 100 includes an analog signal processing unit 110, an A/D converter (ADC) 120, a spectrum analysis unit 130, and a display unit 140. The display unit 140 may be replaced by a display unit 27 of a control device 20 to be described later.

An analog signal processing unit 110 performs analog signal processing such as frequency conversion on the signal to be measured outputted from the mobile terminal 200, and has an attenuator (ATT) 111, a preselector 112, a local signal source 113, a mixer 114, an RBW (Resolution Bandwidth) filter 115, a logarithm (LOG) converter 116, a detector 117, a VBW (Video Bandwidth) filter 118, and a sweep unit 119.

The ATT 111, having an internal resistance, is an electronic part for attenuating a high frequency signal to be measured from the mobile terminal 200 to a signal level that can be processed by the subsequent ADC 120, and does not change the impedance.

The preselector 112 separates an unnecessary signal (spurious response) having a frequency component different from the desired frequency component of the signal to be measured from the mobile terminal 200 and the signal to be measured, and is constituted by a variable tuning filter or the like. Here, the unnecessary signal is a signal caused by a higher-order component of the RF signal and the local signal output from the local signal source 113 in the case that an RF signal having a frequency component different from the desired frequency component of the signal to be measured is inputted to the mixer 114 in the subsequent stage at the same time as the signal to be measured.

The local signal source 113 outputs a sine wave having a higher or lower frequency as a local signal by the value of the frequency of the conversion destination than the value of the original frequency of the signal to be measured. The local signal outputted from the local signal source 113 is swept over a predetermined frequency range by the sweep lamp signal outputted from the sweep unit 119.

The mixer 114 frequency-mixes the signal to be measured of the frequency fS attenuated by the ATT 111 with the local signal of the frequency fL outputted from the local signal source 113, and generates the output signals of the sum component and the difference component of the frequencies of these two signals. That is, it generates an intermediate frequency signal of intermediate frequency |fL−fS| and an intermediate frequency signal of intermediate frequency fL+fS. This means that the mixer 114 is adapted to perform frequency conversion by mixing the signal to be measured with the local signal.

The RBW filter 115 is constituted by an analog bandpass filter or the like, and filters the intermediate frequency signal outputted from the mixer 114 with a resolution bandwidth (RBW) according to the communication standard of the signal to be measured. In this embodiment, the RBW is set equal to the measurement bandwidth (MBW) defined by the 3GPP standard.

The LOG converter 116 converts the output signal level of the RBW filter 115 into decibel units and outputs it to the detector 117.

The detector 117 is, for example, an envelope detector, and is adapted to convert the output of the LOG converter 116 into direct current according to the set detection mode. The detection mode that can be set in the detector 117 is, for example, Positive Peak, Negative Peak, Sample, RMS (Root Mean Square) and the like. In the present embodiment, the RMS is set in the detector 117.

The VBW filter 118 is constituted by, for example, an analog low-pass filter, and has a video bandwidth determined by the cutoff frequency. This VBW filter 118 performs band limitation processing of a predetermined video bandwidth on the signal output from the detector 117, and is adapted to output a signal from which the high frequency component (noise component) of the frequency spectrum waveform finally displayed on the display unit 140 has been removed.

The sweep unit 119 generates a sweep lamp signal for frequency sweeping the frequency fL of the local signal outputted from the local signal source 113 over a predetermined frequency range. In the present embodiment, the sweep unit 119 outputs a sweep lamp signal corresponding to the measurement band (divided band or partial band) set by the band division unit 23*a* or the partial band determination unit 24*a*, which will be described later, to the local signal source 113, whereby, the local signal is frequency-swept over the above measurement band.

Further, the ADC 120 samples the output of the VBW filter 118 at a predetermined sampling rate and converts it into digital data. The ADC 120 is adapted to output this digital data to the spectrum analysis unit 130.

The spectrum analysis unit 130 is adapted to perform a predetermined signal analysis process with respect to the digital data of the signal to be measured outputted from the ADC 120. The signal analysis processing performed by the spectrum analysis unit 130 includes, for example, the generation of the spectrum of the signal to be measured, the measurements for evaluating the quality of the signal to be measured such as the channel power (Channel Power: CHP), the occupied bandwidth (Occupied Band Width: OBW), the adjacent channel leakage power ratio (Adjacent Channel Leakage Ratio: ACLR), Spectrum Emission Mask (SEM), spurious radiation, burst average power, and the like.

As a result, the local signal outputted from the local signal source 113 is frequency-swept according to the measurement band set by the band division unit 23*a* or the partial band determination unit 24*a*, and the signal analysis process with respect to the signal to be measured in the spectrum analysis unit 130 is performed with respect to the measurement band.

Returning to FIG. 1, the control device 20 is provided with a test case storage unit 21, a test execution control unit 22, a display control unit 25, an operation unit 26, and a display unit 27.

The test execution control unit 22 is constituted by, for example, a microcomputer or a personal computer including a CPU, ROM, RAM, HDD, and the like, and controls the operation of each of the above units constituting the measurement system 1. The test execution control unit 22 can constitute at least a part of the PASS evaluation unit 23 and the FAIL evaluation unit 24, which will be described later, by software, by transferring predetermined programs stored in ROM or the like to RAM and executing them on the CPU. The at least a part of the PASS evaluation unit 23 and the FAIL evaluation unit 24 can be configured by a digital circuit such as an FPGA (Field Programmable Gate Array) or an ASIC (Application Specific Integrated Circuit). Alternatively, the at least a part of the PASS evaluation unit 23 and the FAIL evaluation unit 24 can be constituted by appropriately combining hardware processing by a digital circuit and software processing by a predetermined program.

The test case storage unit 21 stores a list of test cases for conformance tests conforming to the 3GPP standard, and parameters such as test conditions and test items for each test case.

The test conditions are conditions set in the measurement device 100 in order to perform a spurious test on the signal to be measured transmitted by the mobile terminal 200. The test conditions are, for example, Initial Conditions defined in 3GPP TS 38.521-1 and 3GPP TS 38.521-3, such as test environment (Test Environment), test frequencies (Test Frequencies), test bandwidth (Test Channel Bandwidths and Test EN-DC bandwidth combination), SCS (Subcarrier Spacing), and the like.

The test items are identified by Test ID and are defined by Test Parameters such as modulation method, RB (Resource Block) placement. Each of the test items is performed per combination of parameters of above test conditions.

When execution of the conformance test is selected by operation input to the operation unit 26 by the user, the test execution control unit 22 reads out the list of test cases stored in the test case storage unit 21, and have the list of the test cases displayed on the display unit 27 through the display control unit 25. Further, the test execution control unit 22 controls the measurement device 100 to perform the measurement of the test of the test cases selected from the list by the operation input to the operation unit 26 by the user.

Further, the test execution control unit 22 includes a PASS evaluation unit 23 and a FAIL evaluation unit 24. The PASS evaluation unit 23 includes a band division unit 23a, a first spurious measurement control unit 23b, and a first pass/fail determination unit 23c. The FAIL evaluation unit 24 includes a partial band determination unit 24a, a second spurious measurement control unit 24b, and a second pass/fail determination unit 24c.

In the evaluation by the PASS evaluation unit 23, the highest priority is to determine whether or not the spurious of the signal to be measured is pass (PASS), but the measurement accuracy of the spurious frequency and level obtained by the measurement device 100 at that time are not regarded as important. For example, the PASS evaluation unit 23 performs the spurious test in a state where the level correction of the measurement device 100 and the adjustment of the tuning frequency of the preselector 112 are omitted and with the number of measured frequency points (hereinafter, also referred to as "trace points") reduced. This means that the PASS evaluation unit 23 is so configured that the PASS determination of spurious can be performed more quickly (for example, in about ⅕ to 1/10 of the conventional time) than in the conventional case.

The band division unit 23a is adapted to divide the measurement frequency band defined by the 3GPP standard into a plurality of divided bands that can be measured by the measurement device 100. Each divided band is set so as not to include the signal band of the carrier. Further, the upper and lower frequency limits of each divided band take into consideration the span error of the measurement device 100. It should be noted that when the measurement frequency band is narrower than the divided band, the band division unit 23a sets the measurement frequency band in consideration of the span error as the divided band.

The first spurious measurement control unit 23b causes the measurement device 100 to measure the spurious of the signal to be measured in each divided band. The measurement device 100 measures the spurious of the signal to be measured while sweeping each divided band according to the control of the first spurious measurement control unit 23b. The number of trace points in each divided band is, for example, Span1/RBW+1. Here, Span1 is the bandwidth of each divided band.

Figure 3:
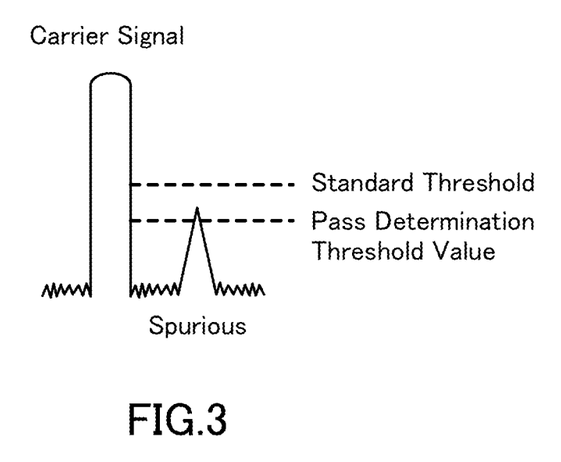
FIG. 3 is a conceptual diagram showing the magnitude relationship between the PASS determination threshold value used by the measurement system according to the embodiment of the present invention and the standard threshold value of the 3GPP standard.

The first pass/fail determination unit 23c is adapted to determine whether or not the peak power of spurious in each divided band measured by the measurement device 100 satisfies the pass determination criteria corresponding to each divided band. For example, the first pass/fail determination unit 23c determines that the peak power of spurious that does not exceed the threshold value of the pass determination criteria (hereinafter, also referred to as "PASS determination threshold value") in each divided band is the peak power (PASS) that meets the pass determination criteria, and determines that the peak power that exceeds the PASS determination threshold in each partial band is the peak power does not meet the pass determination criteria. As shown in FIG. 3, the PASS determination threshold value is set to a value lower than the threshold value of the standard determination criteria defined in the 3GPP standard (hereinafter, also referred to as "standard threshold value"). This is in order to compensate for the decrease in the accuracy of the PASS determination due to the decrease in the measurement accuracy.

Figure 4:
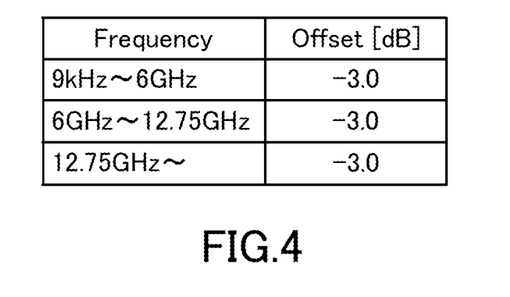
FIG. 4 is a table showing an example of an offset value to be added to the standard threshold value of the 3GPP standard.

The PASS determination threshold value is a value obtained by adding, for example, an offset in the range of −2 dB to −6 dB to the standard threshold value of the 3GPP standard. FIG. 4 is a table showing an example of the correspondence between the measurement frequency band and the offset value to be added to the standard threshold value of the 3GPP standard.

Further, the first pass/fail determination unit 23c determines that the divided band is PASS when the peak power of all spurious meets the acceptance criteria in a certain divided band. On the other hand, when there are spurious whose peak power does not satisfy the pass determination criteria in a certain divided band, the first pass/fail determination unit 23c carries over the evaluation of those spurious to the processing by the FAIL evaluation unit 24.

Further, the first pass/fail determination unit 23c determines that the test result of the test item in which all the peak powers of spurious measured by the measurement device 100 satisfy the acceptance criteria is PASS.

The FAIL evaluation unit 24 remeasures the spurious having a peak power (hereinafter, also referred to as "doubt peak") that does not meet the acceptance criteria by the PASS evaluation unit 23, and determines whether or not the spurious is a failure (FAIL). The FAIL evaluation unit 24 corrects the level of the measurement device 100 and adjusts the tuning frequency of the preselector 112, to cause the measurement device 100 to obtain the spurious frequency and level with high measurement accuracy.

The partial band determination unit 24a is adapted to determine a partial band of a predetermined bandwidth including a spurious having a doubt peak determined by the first pass/fail determination unit 23c in the measurement frequency band not to meet the acceptance criteria. For example, each partial band has a bandwidth of about ±10 MBW centered on one doubt peak. When the measurement frequency band is narrower than the partial band, the partial band determination unit 24a determines the measurement frequency band itself as the partial band. Since the partial band is set narrower than the divided band, the span error of the measurement device 100 can be reduced, and the frequency measurement accuracy can be raised.

The second spurious measurement control unit 24b is adapted to cause the measurement device 100 to remeasure the spurious of the signal to be measured in each partial band, while satisfying the measurement accuracy higher than that of the measurement controlled by the first spurious measurement control unit 23b. The measurement device 100 remeasures the spurious of the signal to be measured while sweeping each partial band under the control of the second spurious measurement control unit 24b. The number of trace points in each partial band is, for example, Span2/RBW+1, which is usually 21 points. Here, Span2 is the bandwidth of each partial band.

The second pass/fail determination unit 24c is adapted to determine whether or not the peak power of spurious in each partial band remeasured by the measurement device 100 satisfies the standard determination criteria corresponding to each partial band. For example, the second pass/fail determination unit 24c determines that the peak power of the spurious that does not exceed the standard threshold value in each partial band is the peak power that satisfies the standard determination criteria, and determines that the peak power that exceeds the standard threshold value in each partial band is the peak power that does not satisfy the determination criteria.

Further, the second pass/fail determination unit 24c stores the peak power and frequency when there is a spurious whose peak power does not meet the standard determination criteria in a certain partial band. On the other hand, when all the doubt peaks in a certain divided band satisfy the standard determination criteria, the second pass/fail determination unit 24c determines the divided band as PASS. Further, the second pass/fail determination unit 24c determines a test result of a test item in which even one peak power of spurious remeasured by the measurement device 100 does not satisfy the pass determination criteria as FAIL.

The display control unit 25, which generates an image to be displayed on the display unit 27 and has it displayed on the display unit 27, is adapted to control the generation and display of the image according to the instruction of the test execution control unit 22. Further, the display control unit 25 changes the display of the display unit 27 based on the information inputted to the operation unit 26, and transmits the information inputted to the operation unit 26 to the test execution control unit 22.

The operation unit 26, which is for receiving an operation inputted by the user, is constituted by, for example, a touch panel provided with a touch sensor for detecting a contact position by a contact operation with the input surface corresponding to the display screen of the display unit 27. Alternatively, the operation unit 26 may be configured to include an input device such as a keyboard or a mouse. The operation inputted to the operation unit 26 is adapted to be detected by the display control unit 25. For example, the operation unit 26 allows the user to arbitrarily set the specifications of the mobile terminal 200, parameters of various test conditions, the signal band of the carrier of the signal to be measured, the offset to be added to the standard threshold value, and the like.

The display unit 27, constituted by a display device such as a liquid crystal display or a CRT, is adapted to display various display contents such as the setting screen and test results related to the measurement for the spurious test on the mobile terminal 200 by the measurement device 100 based on the display control by the display control unit 25. This display content includes, for example, a list of test cases, a measurement result of spurious measurement of the mobile terminal 200 by the measurement device 100, a determination result of the spurious test, and the like. Further, the display unit 27 is adapted to display an operation target such as a button, a soft key, a pull-down menu, and a text box for setting various conditions.

Figure 5:
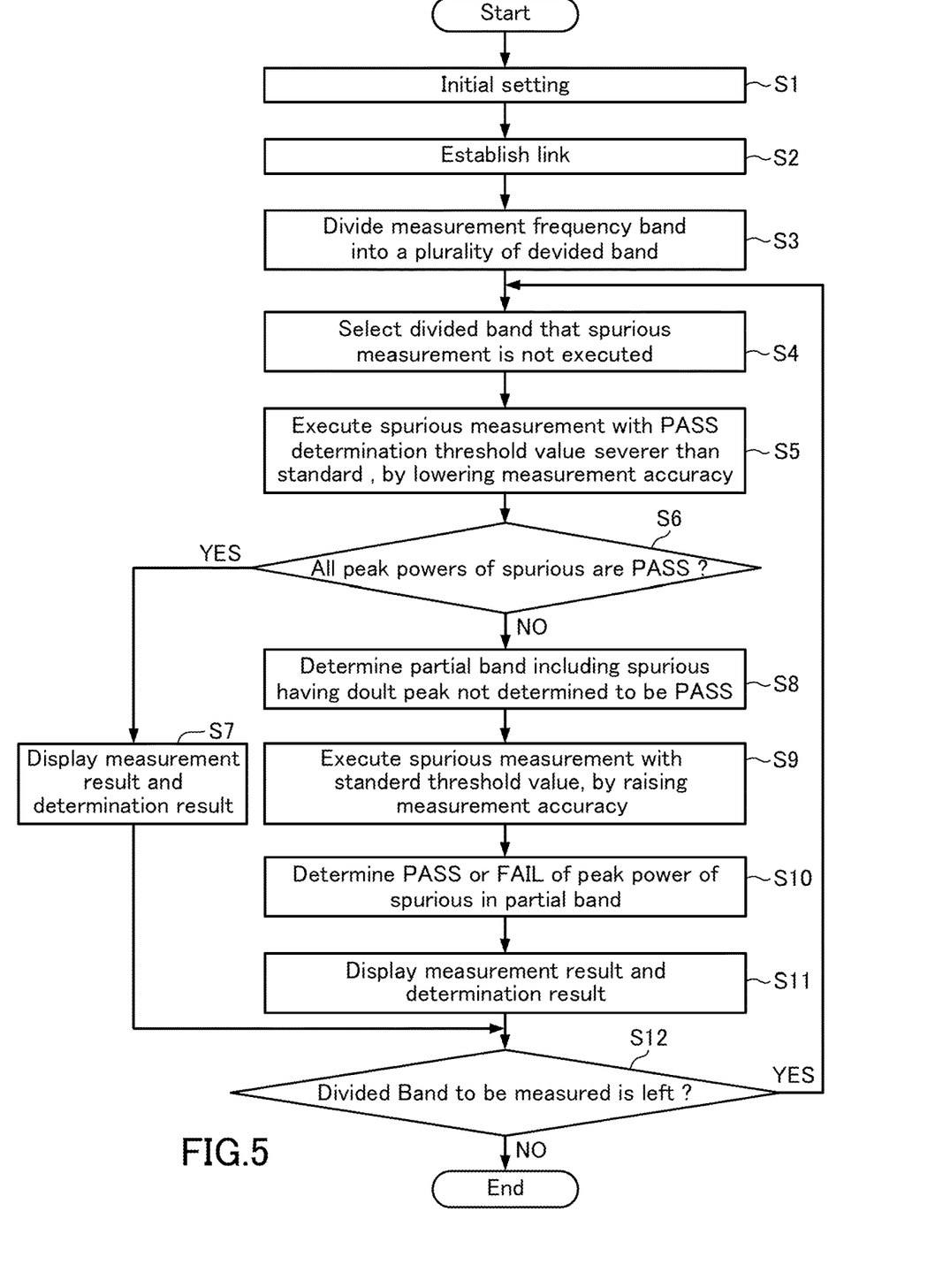
FIG. 5 is a flowchart showing a process of a measurement method using the measurement system according to the embodiment of the present invention.

Hereinafter, the measurement method using the measurement system 1 will be described with reference to the flowchart of FIG. 5.

First, the test execution control unit 22 sets various information such as specifications of the mobile terminal 200, parameters of various test conditions, a signal band of the carrier of the signal to be measured, an offset to be added to the standard threshold value, and the like, in accordance with an operation input to the operation unit 26 by the user (Step S1).

Next, the test execution control unit 22 establishes a link (call) between the pseudo base station unit 11 and the mobile terminal 200 (Step S2).

Next, the band division unit 23a divides the measurement frequency band into a plurality of divided bands (Band Division Step S3).

Next, the test execution control unit 22 selects a divided band for which spurious measurement has not yet been performed (Step S4).

Next, the first spurious measurement control unit 23b causes the measurement device 100 to measure the signal to be measured in the divided band selected in step S4 with the measurement accuracy lowered (First Spurious Measurement Control Step S5).

The first pass/fail determination unit 23c determines whether or not the peak power of spurious in the divided band measured by the measurement device 100 in step S5 satisfies the pass determination criteria (PASS) or not (FAIL) according to the divided band. (First Pass/Fail Determination Step S6). In the first pass/fail determination step S6, the peak power that does not exceed the PASS determination threshold value in each divided band is determined to be the peak power that satisfies the acceptance determination criteria. Further, in the first pass/fail determination step S6, the peak power exceeding the PASS determination threshold value in each divided band is determined to be the peak power that does not satisfy the acceptance determination criteria. The PASS determination threshold is lower than the standard threshold value specified in the 3GPP standard.

When all the peak powers of spurious in the divided band selected in step S4 are determined to be PASS, the test execution control unit 22 performs the process of step S7 described later. On the other hand, if even one spurious peak power in the divided band selected in step S4 is not determined to be PASS, the test execution control unit 22 performs the process of step S8.

In step S7, the test execution control unit 22 causes the measurement result obtained in the divided band selected in step S4 and the determination result that the peak power of all spurious in the divided band selected in step S4 is PASS, displayed on the display unit 27 through the display control unit 25.

In step S8, the partial band determination unit 24a determines the partial band having a predetermined bandwidth including the spurious having a doubt peak determined not to satisfy the pass determination criteria by the first pass/fail determination step S6 in the divided band selected in step S4 (Partial Band Determination Step S8).

Next, the second spurious measurement control unit 24b has the measurement device 100 perform the remeasurement of the spurious of the signal to be measured in the partial band determined in step S8, in a state that satisfied the measurement accuracy higher than the measurement by the control by the first spurious measurement control step S5 (Second Spurious Measurement Control Step S9).

Next, the second pass/fail determination unit 24c determines whether the peak power of the spurious in the partial band remeasured by the measurement device 100 in step S9 satisfies (PASS) the standard determination criteria according to the partial band or not (FAIL) (second pass/fail determination step S10). It should be noted that the second pass/fail determination step S10 determines the peak power not exceeding the standard threshold value at each partial band as the peak power satisfying the standard determination criteria, and determines the peak power exceeding the standard threshold value as the peak power not satisfying the standard determination criteria.

Next, the test execution control unit 22 has the display unit 27, through the display control unit 25, display the measurement result obtained in the partial band determined in step S8, and the determination result of whether the peak power of the spurious in the partial band determined in step S8 is PASS or FAIL (Step S11).

Next, the test execution control unit 22 determines whether or not there remains a divided band that the spurious measurement is not performed (Step S12). If there remains a divided band that the spurious measurement should be performed, the process of S4 and subsequent processes are performed again. On the other hand, if there remains no divided band that the spurious measurement should be performed, a series of processes end.

As described above, the measurement system 1 according to the present embodiment is adapted to use the threshold value of the pass determination criteria lower than the threshold value of the standard determination criteria specified by the 3GPP standard. The measurement system 1 according to the present embodiment can be lower the measurement accuracy instead of setting a pass criteria threshold that is stricter than the standard criteria threshold, so that the measurement for passing the spurious test can be completed in a shorter time than before. As a result, the measurement system 1 according to the present embodiment can accelerate the design and development of wireless devices such as mobile terminals and base station devices by users.

Further, the measurement system 1 according to the present embodiment is adapted to have the measurement device 100 perform the remeasurement of the spurious of the signal to be measured by raising the measurement accuracy in the partial band including the spurious having the peak power determined not to satisfy the pass determination criteria by the first pass/fail determination unit 23c. As a result, the measurement system 1 according to the present embodiment can obtain the frequency and the level with high accuracy, regarding the spurious turned to be FAIL.

EXPLANATION OF REFERENCE NUMERALS

1 Measurement System
23 Pass Evaluation Unit
23a Band Division Unit
23b First Spurious Measurement Control Unit
23c First Pass/Fail Determination Unit
24 Fail Evaluation Unit
24a Partial Band Determination Unit
24b Second Spurious Measurement Control Unit
24c Second Pass/Fail Determination Unit
100 Measurement device
200 Mobile Terminal (Object To Be Measured)

What is claimed is:

1. A measurement system (1) comprising:
a measurement device (100); and
a control device (20) that causes the measurement device to measure spurious included in a signal to be measured transmitted from an object (200) to be measured, wherein
the control device is provided with
a band division unit (23a) that divides measurement frequency band into a plurality of divided bands,
a first spurious measurement control unit (23b) that causes the measurement device to measure spurious of the signal to be measured in each of the divided bands, and
a first pass/fail determination unit (23c) that determines whether or not a peak power of the spurious in each of the divided bands measured by the measurement device satisfies pass determination criteria according to each of the divided bands, and
the first pass/fail determination unit determines the peak power that does not exceed the threshold value of the pass determination criteria in each divided band as the peak power that satisfies the pass determination criteria, and determines the peak power that exceeds the threshold value of the pass determination criteria as the peak power that does no satisfy the pass determination criteria, and
the threshold value of the pass determination standard is a power value lower than the threshold value of the standard determination criteria defined by the 3GPP standard.

2. The measurement system according to claim 1, wherein the control device of the measurement system is further provided with:
a partial band determination unit (24a) that determines a partial band having a predetermined bandwidth including the spurious having a peak power determined not to satisfy the pass determination criteria by the first pass/fail determination unit in the measurement frequency band;
a second spurious measurement control unit (24b) that causes the measurement device to measure the spurious of the signal to be measured in the partial band, in a state where a measurement accuracy higher than the measurement by the control of the first spurious measurement control unit is satisfied; and
a second pass/fail determination unit (24c) that determines whether or not the peak power of the spurious in the partial band remeasured by the measurement device satisfies the standard determination criteria according to the partial band, and
the second pass/fail determination unit is configured to determine the peak power that does not exceed the threshold value of the standard determination criteria as the peak power that satisfies the standard determination criteria, and determine the peak power that exceeds the threshold value of the standard determination criteria as the peak power that does not satisfy the standard determination criteria.

3. A measurement method to cause a measurement device (100) to measure spurious included in a signal to be measured transmitted from an object (200) to be measured, the method comprising:
a band division step (S3) to divide measurement frequency band into a plurality of divided bands;

a first spurious measurement control step (S5) to cause the measurement device to measure the spurious of the signal to be measured in each of the divided bands; and a first pass/fail determination step (S6) to determine whether or not a peak power of the spurious in each of the divided bands measured by the measurement device satisfies the pass determination criteria according to each of the divided band, and the first pass/fail determination step determines the peak power that does not exceed the threshold value of the pass determination criteria in each of the divided band as the peak power satisfying the pass determination criteria, and determines the peak power exceeding the threshold value of the pass determination criteria as the peak power not satisfying the pass determination criteria, and the threshold value of the pass determination criteria is a power value lower than the threshold value of the standard determination criteria defined by the 3GPP standard.

4. The measurement method according to claim 3 further provided with:

a partial band determination step (S8) to determine a partial band having a predetermined bandwidth including the spurious having a peak power determined not to satisfy the pass determination criteria by the first pass/fail determination unit in the measurement frequency band;

a second spurious measurement control step (S9) to cause the measurement device to perform a remeasurement of the spurious of the signal to be measured in the partial band, in a state where a measurement accuracy higher than the measurement by the control of the first spurious measurement control unit is satisfied; and a second pass/fail determination step (S10) to determine whether or not the peak power of the spurious in the partial band remeasured by the measurement device satisfies the standard determination criteria according to the partial band, and the second pass/fail determination step is configured to determine the peak power that does not exceed the threshold value of the standard determination criteria as the peak power that satisfies the standard determination criteria, and to determine the peak power that exceeds the threshold value of the standard determination criteria as the peak power that does not satisfy the standard determination criteria.

* * * * *